United States Patent
Nagahara

(10) Patent No.: US 8,397,182 B2
(45) Date of Patent: Mar. 12, 2013

(54) PATTERN VERIFYING METHOD, PATTERN VERIFYING DEVICE, PROGRAM, AND MANUFACTURING METHOD OF SEMICONDUCTOR DEVICE

(75) Inventor: Seiji Nagahara, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 215 days.

(21) Appl. No.: 12/457,105

(22) Filed: Jun. 1, 2009

(65) Prior Publication Data

US 2009/0298205 A1    Dec. 3, 2009

(30) Foreign Application Priority Data

Jun. 3, 2008 (JP) ................. 2008-145681

(51) Int. Cl.
*G06F 17/50* (2006.01)
(52) U.S. Cl. ............... 716/53; 716/52; 716/54; 716/55; 716/56; 716/106; 430/5; 430/30
(58) Field of Classification Search .............. 716/50–56, 716/106, 110, 111, 112; 430/5, 30
See application file for complete search history.

(56) References Cited

U.S. PATENT DOCUMENTS

| 2007/0018286 A1 | 1/2007 | Chen |
| 2008/0022240 A1 | 1/2008 | Nojima |
| 2008/0307381 A1* | 12/2008 | Tritchkov et al. ............... 716/11 |
| 2009/0199137 A1* | 8/2009 | Huckabay et al. ............... 716/4 |

FOREIGN PATENT DOCUMENTS

| JP | 2006-154597 A | 6/2006 |
| JP | 2007-27742 A | 2/2007 |
| JP | 2007-310085 A | 11/2007 |

OTHER PUBLICATIONS

Japanese Office Action dated Jul. 24, 2012 with a partial English translation thereof.

* cited by examiner

*Primary Examiner* — Nha Nguyen
(74) *Attorney, Agent, or Firm* — McGinn IP Law Group, PLLC

(57) ABSTRACT

An overlapping margin of a second pattern for a first pattern is corrected for at least one of the first pattern and the second pattern (S50). Next, a relative distance between the first pattern and the second pattern after the overlapping margin is corrected is calculated (S60). Next, it is determined whether or not the relative distance satisfies a criterion (S70). Thus, the pattern can be verified under the consideration of the overlapping margin.

14 Claims, 13 Drawing Sheets

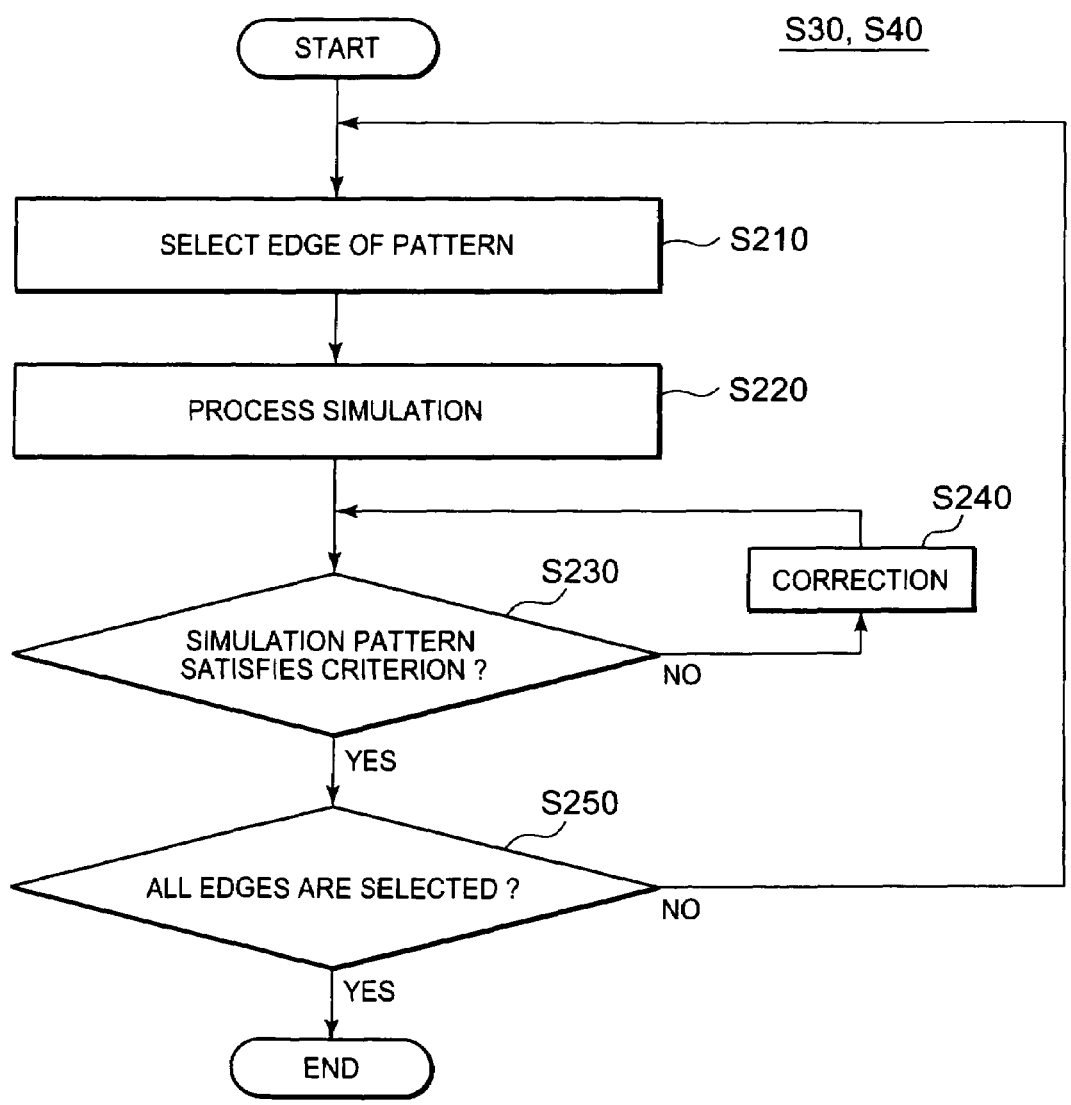

PATTERN VERIFYING METHOD, PATTERN VERIFYING DEVICE, PROGRAM, AND MANUFACTURING METHOD OF SEMICONDUCTOR DEVICE

The present application is an application based on Japanese Patent Application No. 2008-145681.

BACKGROUND OF THE INVENTION

1. Field of the Invention

The present invention relates to a pattern verifying method, a pattern verifying device, a program, and a manufacturing method of a semiconductor device, in which a pattern used for a double patterning method is verified.

2. Description of the Related Art

In recent years, the semiconductor device has been miniaturized. As a technique for realizing the miniaturization exceeding a resolution limit of lithography, the double patterning method is largely expected. As described in Japanese Patent Laid-Open No. 2007-27742, the double patterning method is a method in which a pattern belonging to one layer is divided to two patterns, and each of the divided patterns is exposed and developed.

As another method which realizes the miniaturization of the semiconductor device, some technique uses a Levenson type phase shift mask. In this technique, a final pattern is obtained on a wafer by using two masks in which shapes of an aperture part and phase differences are different from each other. The resolutions are different from each other in the two patterns formed by the two masks. In a technique described in Japanese Patent Laid-Open No. 2007-310085, when a process simulation of the Levenson type phase shift mask is executed, an allowable margin is individually set for each of the two masks, the process simulation is executed by using the pattern of at least one of the two masks, and a result of the simulation is compared with the allowable margin.

When using such techniques, the inventor of the present application has newly known the following problems. As described above, the double patterning method is a method in which the pattern belonging to one layer is divided to the two patterns, and each of the divided patterns is exposed and developed. Thus, when an overlapping margin is induced in the divided patterns, parts to be normally connected may be separated, and parts to be normally divided may be connected. Thus, when the double patterning method is used, it is preferable to verify the pattern under consideration of the overlapping margin. However, in the techniques described in the above Patent Documents, it is not possible to verify the pattern under the consideration of the overlapping margin.

SUMMARY

According to the present invention, a pattern verifying method is provided, which is used for a double patterning method which forms a second pattern in a film to be processed after forming a first pattern in the film to be processed, for verifying the first pattern and the second pattern, including:

correcting an overlapping margin between the first pattern and the second pattern for at least one of the first pattern and the second pattern;

calculating a relative distance between the first pattern and the second pattern after the overlapping margin is corrected; and determining whether or not the relative distance satisfies a criterion.

According to the present invention, it is determined whether or not the relative distance satisfies the criterion by calculating the relative distance between the first pattern and the second pattern after the overlapping margin is corrected. Thus, it is possible to verify the pattern under the consideration of the overlapping margin.

According to the present invention, a pattern verifying device is provided, which is used for the double patterning method in which the second pattern is formed in the film to be processed after the first pattern is formed in the film to be processed, and which verifies the first pattern and the second pattern, including:

a margin correcting unit which corrects the overlapping margin between the first pattern and the second pattern to at least one of the first pattern and the second pattern;

a relative distance calculating unit which calculates the relative distance between the first pattern and the second pattern after the overlapping margin is corrected; and a determining unit which determines whether or not the relative distance satisfies the criterion.

According to the present invention, a program is provided, which causes a computer to function as a pattern verifying device which verifies the first pattern and the second pattern in the double patterning method for forming the first pattern and the second pattern in the film to be processed in this order, causing the computer to include:

a function for correcting the overlapping margin of the second pattern for the first pattern to at least one of the first pattern and the second pattern;

a function for calculating the relative distance between the first pattern and the second pattern after the overlapping margin is corrected; and a function for determining whether or not the relative distance satisfies a criterion.

According to the present invention, a manufacturing method of a semiconductor device is provided for forming the second pattern in the film to be processed after the first pattern is formed in the film to be processed, including:

verifying the first pattern and the second pattern;

forming a first reticle for forming the first pattern, and forming a second reticle for forming the second pattern;

forming the first pattern in the film to be processed by using the first reticle; and forming the second pattern in the film to be processed by using the second reticle, wherein the verifying the first pattern and the second pattern includes:

correcting the overlapping margin of the second pattern for the first pattern to at least one of the first pattern and the second pattern;

calculating the relative distance between the first pattern and the second pattern after the overlapping margin is corrected; and determining whether or not the relative distance satisfies the criterion.

BRIEF DESCRIPTION OF THE DRAWINGS

The above and other objects, advantages and features of the present invention will be more apparent from the following description taken in conjunction with the accompanying drawings, in which:

FIG. 3 is a flowchart illustrating details of processes indicated at S30 and S40 of FIG. 1;

DETAILED DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Embodiments of the present invention will be described below by using the drawings. Meanwhile, in all of the drawings, the same code is attached to the same component, and the description will be arbitrarily omitted.

Figure 1:
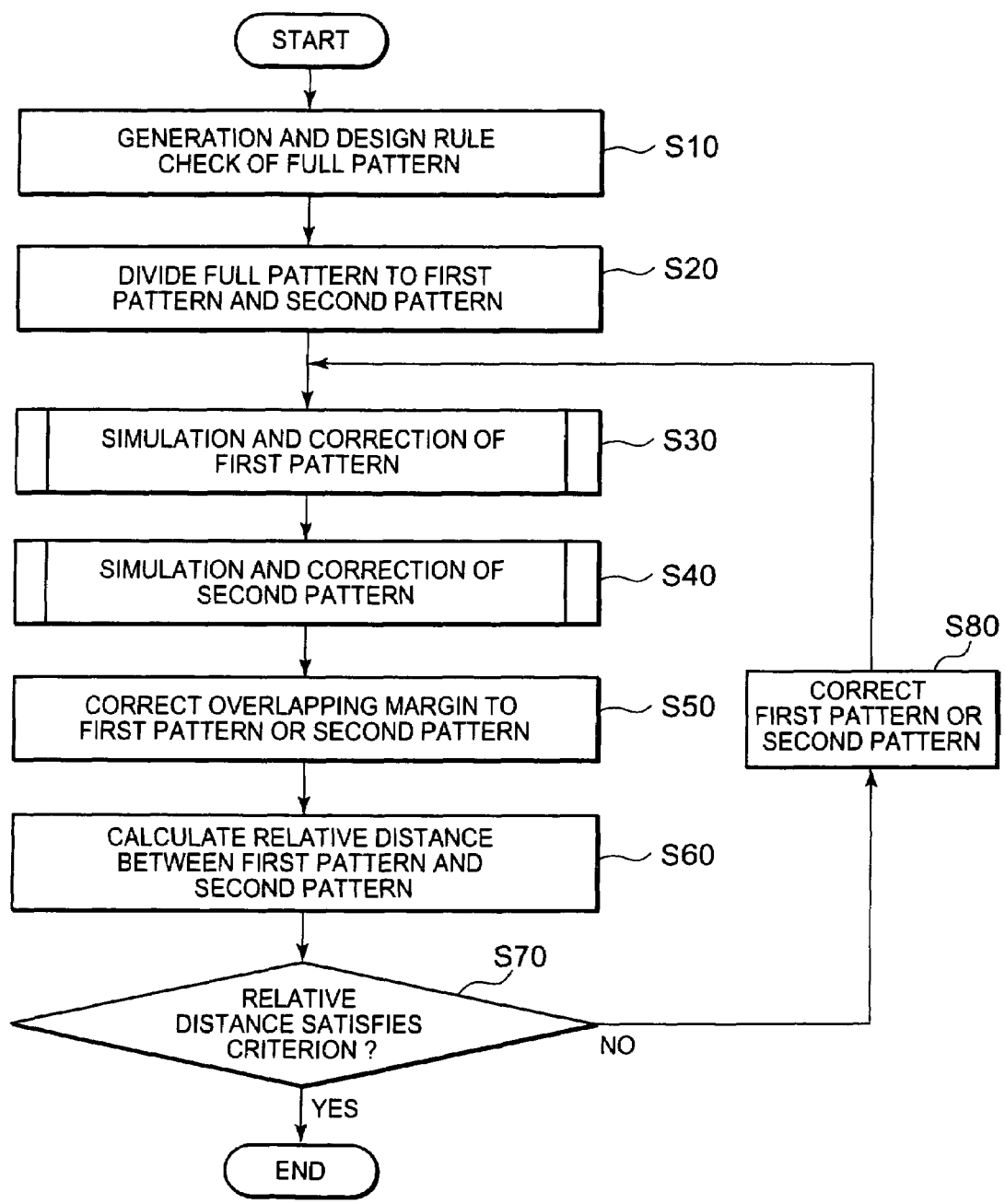
FIG. 1 is a flowchart illustrating a pattern verifying method according to a first embodiment.

FIG. 1 is a flowchart illustrating a pattern verifying method according to a first embodiment. This pattern verifying method is used for a double patterning method in which a second pattern is formed in a film to be processed after a first pattern is formed in the film to be processed, is a method which verifies the first pattern and the second pattern, and includes the following steps. First, an overlapping margin of the second pattern for the first pattern is corrected to at least one of the first pattern and the second pattern (S50). Next, a relative distance between the first pattern and the second pattern after the overlapping margin is corrected is calculated (S60). Next, it is determined whether or not the relative distance satisfies a criterion (S70). Thus, the pattern can be verified under the consideration of the overlapping margin. Hereinafter, after a configuration of a pattern verifying device used for this pattern verifying method is described, FIG. 1 will be described in detail.

Figure 2:
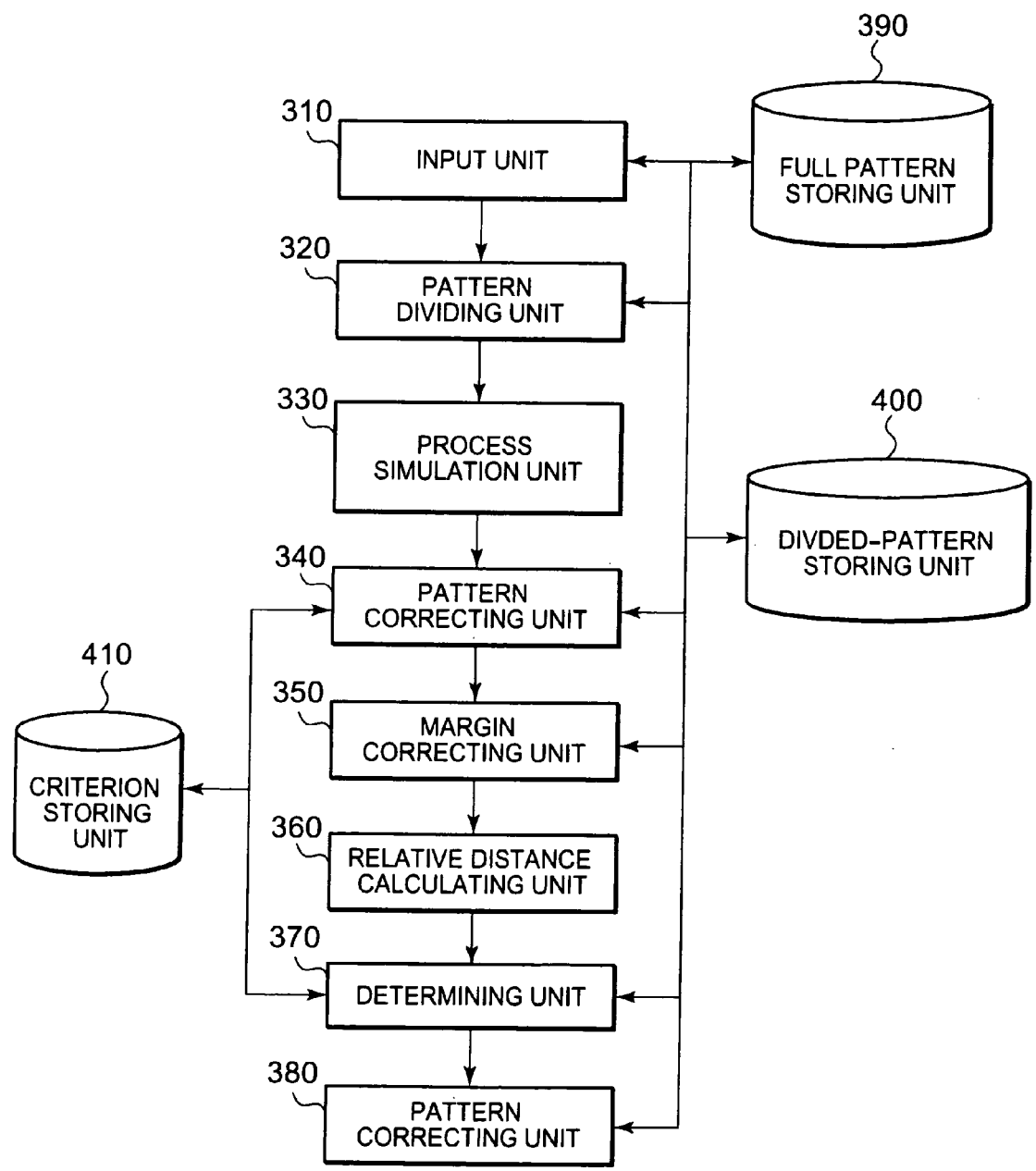
FIG. 2 is a block diagram illustrating a configuration of a pattern verifying device used for the pattern verifying method of FIG. 1.

FIG. 2 is a block diagram illustrating a configuration of the pattern verifying device used for the pattern verifying method of FIG. 1. This pattern verifying device is, as a function unit, provided with an input unit 310, a pattern dividing unit 320, a process simulation unit 330, a pattern correcting unit 340, a margin correcting unit 350, a relative distance calculating unit 360, a determining unit 370, and a pattern correcting unit 380, and is, as a storing unit, provided with a full pattern storing unit 390, a divided-pattern storing unit 400, and a criterion storing unit 410.

The input unit 310 is a part in which a user executes a variety of inputs for the pattern verifying device. Details of the processes will be described later by using flowcharts, which are executed by the pattern dividing unit 320, the process simulation unit 330, the pattern correcting unit 340, the margin correcting unit 350, the relative distance calculating unit 360, the determining unit 370, and the pattern correcting unit 380.

The full pattern storing unit 390 stores a pattern (hereinafter, described as full pattern) before each layer of a semiconductor device is divided. The full pattern storing unit 390 stores the full pattern which has been previously verified by the pattern verifying device for the lower layer than the layer which is being currently processed by the pattern verifying device.

The divided-pattern storing unit 400 stores the first pattern and the second pattern generated by dividing the full pattern to two parts. The divided-pattern storing unit 400 stores the first pattern and the second pattern which have been previously verified by the pattern verifying device for the lower layer than the layer which is being currently processed by the pattern verifying device. The divided-pattern storing unit 400 stores the first pattern and the second pattern in which the latest correction is reflected for the layer which is being currently processed by the pattern verifying device.

The criterion storing unit 410 stores a variety of criteria to be satisfied by the first pattern and the second pattern. The criterion storing unit 410 stores a first criterion condition which is, for example, a condition to be satisfied by the relative distance between the first pattern and the second pattern after the overlapping margin is corrected. The first criterion condition is, for example, such a condition that the first pattern and the second pattern are separated from each other by a certain distance or more in a part in which the first pattern and the second pattern are to be separated from each other, and is, for example, such a condition that the first pattern and the second pattern are overlapped with each other by a certain width or more in a part in which the first pattern and the second pattern are to be overlapped with each other. The criterion storing unit 410 also stores a second criterion condition indicating a criterion to be satisfied by an edge of the pattern after a process simulation.

Meanwhile, each component of the pattern verifying device illustrated in FIG. 2 does not indicate a configuration of hardware units, but a block of function units. Each component of the pattern verifying device is realized by an arbitrary combination of hardware and software whose main parts are a CPU of an arbitrary computer, a memory, a program for realizing the components of FIG. 2, which is loaded in the memory, a storing unit, such as a hard disk, which stores the program, an interface for connecting to a network, and the like. It can be understood by those skilled in the art that the realizing method and the realizing device include a variety of modified examples.

Next, FIG. 1 will be described in details. First, a user of the pattern verifying device generates the full pattern of a target layer, and executes a design rule check for the generated full pattern (S10). This process is executed by using a pattern generating device. The pattern generating device may be the same computer as that of the pattern verifying device. The full pattern passing the design rule check is stored in the full pattern storing unit 390 of the pattern verifying device.

Next, the user inputs an instruction for dividing the full pattern generated at S10 to the first pattern and the second pattern to the input unit 310 of the pattern verifying device. The input unit 310 outputs the inputted instruction to the pattern dividing unit 320. The pattern dividing unit 320 reads out the full pattern generated at S10 from the full pattern storing unit 390, and divides the read-out full pattern to the first pattern and the second pattern (S20). The first pattern includes two sub-patterns separated from each other, and the second pattern includes the pattern positioned between the two sub-patterns. In this case, the pattern dividing unit 320 executes, by necessity, a process such as the correction of an auxiliary pattern for the first pattern and the second pattern.

The pattern dividing unit 320 causes the divided-pattern storing unit 400 to store the generated first pattern and second pattern. The pattern dividing unit 320 outputs, to the process simulation unit 330, a signal indicating such a fact that the first pattern and the second pattern are generated When the signal is inputted from the pattern dividing unit 320, the process simulation unit 330 reads out the first pattern and the second pattern generated at S20 from the divided-pattern storing unit 400. Next, the process simulation unit 330 and the pattern correcting unit 340 executes a process simulation and a correction of the first pattern (S30), and executes the process simulation and the correction of the second pattern (S40) In this case, the pattern correcting unit 340 updates the first pattern and the second pattern stored in the divided-pattern storing unit 400 to the corrected patterns. The pattern correcting unit 340 outputs, to the margin correcting unit 350, a signal indicating such a fact that the correction is completed.

The margin correcting unit 350 reads out the first pattern and the second pattern from the divided-pattern storing unit 400, executes a process for correcting the overlapping margin to the first pattern or the second pattern (S50), and outputs, to the relative distance calculating unit 360, the first pattern and the second pattern after the overlapping margin is corrected. A size of the overlapping margin is, for example, determined under the consideration of the features of an exposing device and a developing device, and a variation of a ground film. For example, a margin induced by the exposing device is induced by a variation of an exposure quantity and a variation of a focus. Specifically, the size of the overlapping margin is, for example, equal to or more than 5 nm and equal to or less than 50 nm, or ¼ of the minimum pattern width. Meanwhile, details of a correcting process for the overlapping margin will be described later by using the drawings.

Next, the relative distance calculating unit 360 calculates the relative distance between the first pattern and the second pattern inputted from the margin correcting unit 350 (S60). Specifically, the relative distance calculating unit 360 extracts all edges of the first pattern, and calculates the shortest distance between each of the extracted edges and the second pattern. The relative distance calculating unit 360 extracts all edges of the second pattern, and calculates the shortest distance between each of the extracted edges and the first pattern. When the extracted edge is overlapped with other pattern, the relative distance calculating unit 360 calculates a width of an overlapped part as the relative distance. The relative distance calculating unit 360 outputs, to the determining unit 370, all of pieces of edge position information indicating a position of the extracted edge as relating the edge position information to the relative distance corresponding to the edge.

Next, the determining unit 370 reads out the full pattern from the full pattern storing unit 390, and specifies the position of the edge in the full pattern by using the edge position information inputted from the relative distance calculating unit 360. The determining unit 370 determines whether the specified edge is a part to be separated from other pattern, or is a part to be connected to other pattern.

Next, the determining unit 370 reads out, from the criterion storing unit 410, the first criterion condition to be satisfied by the relative distance. The first criterion condition varies as depending on whether the edge is the part to be separated from other pattern or is the part to be connected to other pattern. When the edge is the part to be separated from other pattern, the first criterion condition is that the relative distance is a criterion value or more, and when the edge is the part to be overlapped with other pattern, the first criterion condition is that the relative distance is overlapped by the criterion value or more.

Next, the determining unit 370 determines whether or not the relative distance inputted from the relative distance calculating unit 360 satisfies the first criterion condition (S70). When the relative distance satisfies the first criterion condition in all of the edges (S70: Yes), the pattern verifying device completes an operation. When the relative distance does not satisfy the first criterion condition in some edge (S70: No), the determining unit 370 outputs, to the pattern correcting unit 380, position information on the edge which does not satisfy the first criterion condition, and correction information indicating how the edge is to be corrected. When the edge is the part to be separated from other pattern, the correction information indicates such a fact that the edge is moved in a direction for separating the part from other pattern, and when the edge is the part to be overlapped with other pattern, the correction information indicates such a fact that the edge is moved in a direction for overlapping the part with other pattern.

The pattern correcting unit 380 reads out the first pattern and the second pattern from the divided-pattern storing unit 400. Based on the position information inputted from the determining unit 370, the pattern correcting unit 380 specifies the edge which does not satisfy the criterion condition, and corrects a shape of the specified edge based on the correction information (S80). The pattern correcting unit 380 updates the first pattern and the second pattern stored in the divided-pattern storing unit 400 to the corrected first pattern and second pattern.

Next, the pattern correcting unit 380 outputs, to the process simulation unit 330, information indicating such a fact that the first pattern and the second pattern are corrected. After that, the pattern verifying device repeats the processes indicated at S30 to S70. As described above, the verification and the correction of the first pattern and the second pattern are executed.

FIG. 3 is a flowchart illustrating details of processes indicated at S30 and S40 of FIG. 1. The processes indicated at S30 and S40 are the same as each other except that the patterns to be processed are different from each other.

First, the process simulation unit 330 selects the edge of the first pattern or the second pattern (S210). Next, the process simulation unit 330 executes the process simulation for the selected edges, and generates a simulation pattern of the selected edge (S220). In the process simulation executed here, the pattern projected by the exposure is, for example, calculated by the simulation, and a wavelength of laser light, a shape of illumination, a setting value and a characteristic value of a lens, and the like are included as parameters. According to necessity, a shape simulation in an etching case is also included in the process simulation. The process simulation unit 330 outputs, to the pattern correcting unit 340, the information indicating the simulation pattern and the position of the selected edge.

The pattern correcting unit 340 reads out the second criterion condition from the criterion storing unit 410, and determines whether or not the inputted simulation pattern satisfies the second criterion condition (S230). When the simulation pattern does not satisfy the criterion (S230: No), the pattern correcting unit 340 corrects the pattern, and updates the pattern stored in the divided-pattern storing unit 400 to the corrected pattern (S240). This correction is, for example, Optical Proximity Effect Correction (hereinafter, described as OPC). The OPC may be a rule based OPC in which a correction table is used, or may be a model based OPC in which the correction is executed by the calculation. After that, the process simulation unit 330 and the pattern correcting unit 340 repeat the processes at S220 to S240 until the simulation pattern satisfies the criterion. The process simulation unit 330 and the pattern correcting unit 340 repeat the processes indicated at S210 to S240 until all of the edges are selected (S250).

Figure 4A:
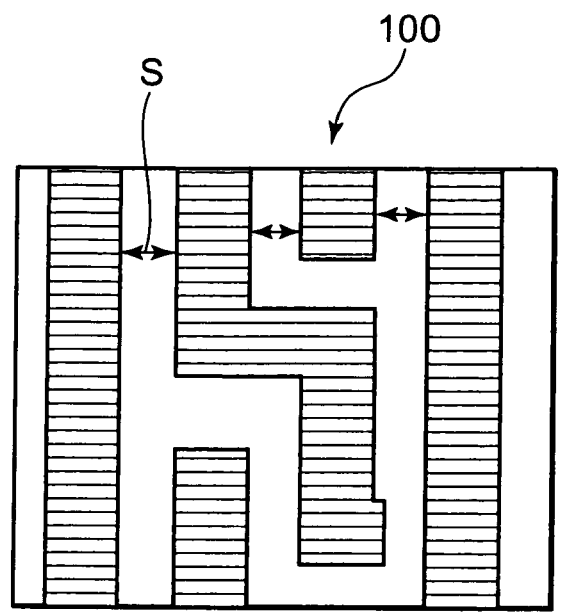
FIG. 4A is a view illustrating a full pattern before the division.

FIG. 4 is a view illustrating a specific example of a dividing process for the full pattern, which is executed by the pattern dividing unit 320. FIG. 4A is a view illustrating a full pattern 100 before the division. The full pattern 100 illustrated in FIG. 4A includes a plurality of line-like patterns extending upward and downward, and a relative distance S between such patterns is, for example, a distance defined by a minimum design rule of the semiconductor device, and is smaller than a resolution limit of lithography. The line-like patterns neighboring to each other are partly connected to each other.

Figure 4B:
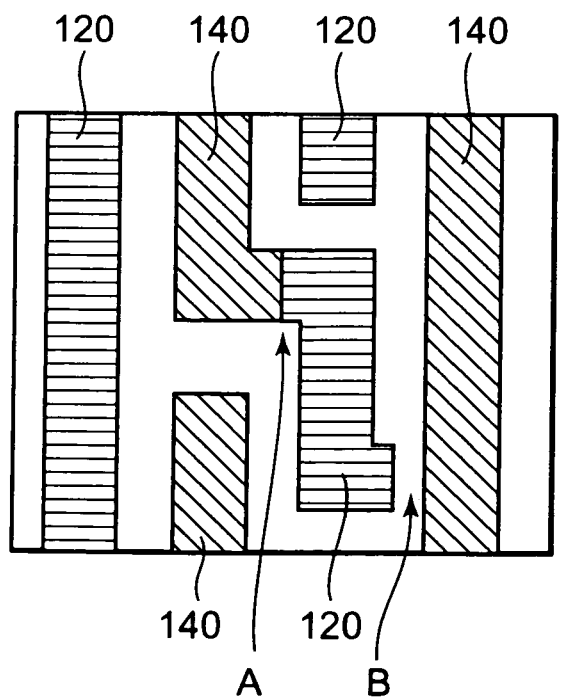
FIG. 4B is a view illustrating such a condition that the full pattern is divided to a first pattern and a second pattern.

FIG. 4B is a view illustrating such a condition that the full pattern 100 of FIG. 4A is divided to a first pattern 120 and a second pattern 140. The first pattern 120 and the second pattern 140 include a plurality of the sub-patterns extending upward and downward. The sub-pattern of the first pattern 120 and the sub-pattern of the second pattern 140 are alternately positioned. The first pattern 120 and the second pattern 140 include a part A in which the first pattern 120 and the second pattern 140 are to be connected to each other, and a part B in which the first pattern 120 and the second pattern 140 are to be separated from each other.

Figure 5:
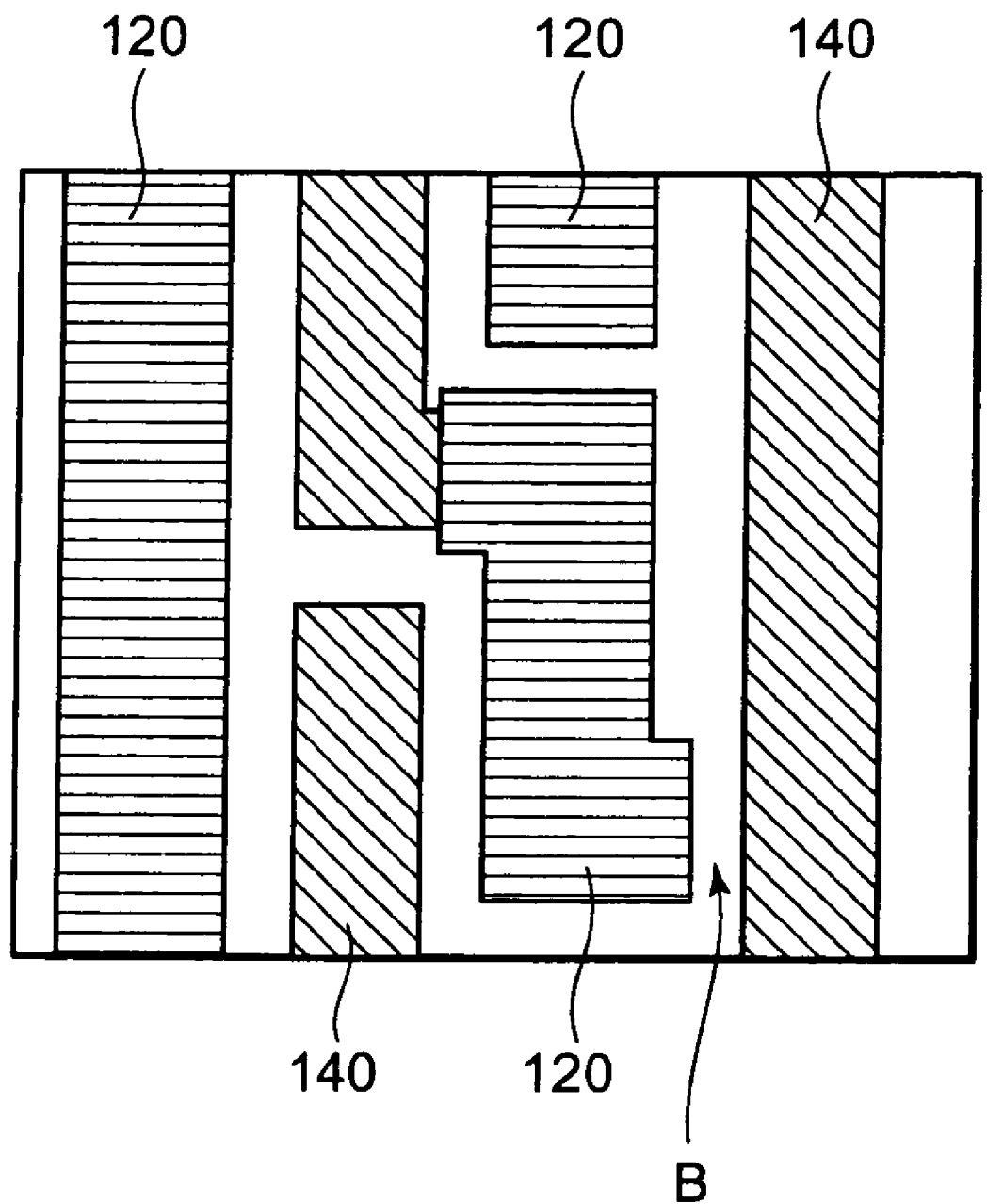
FIG. 5 is a view illustrating a first example of a correcting process for an overlapping margin, which is executed by a margin correcting unit.

FIG. 5 is a view illustrating a first example of the correcting process for the overlapping margin, which is executed by the margin correcting unit 350. In this example, the margin correcting unit 350 fattens at least one of the first pattern 120 and the second pattern 140 by the overlapping margin throughout all circumferences. In FIG. 5, the margin correcting unit 350 fattens the first pattern 120 by the overlapping margin throughout all circumferences.

In this example, the determining unit 370 determines whether or not the first pattern 120 and the second pattern 140 are separated from each other by the criterion value or more in the part B in which the first pattern 120 and the second pattern 140 are to be separated from each other.

Figure 6:
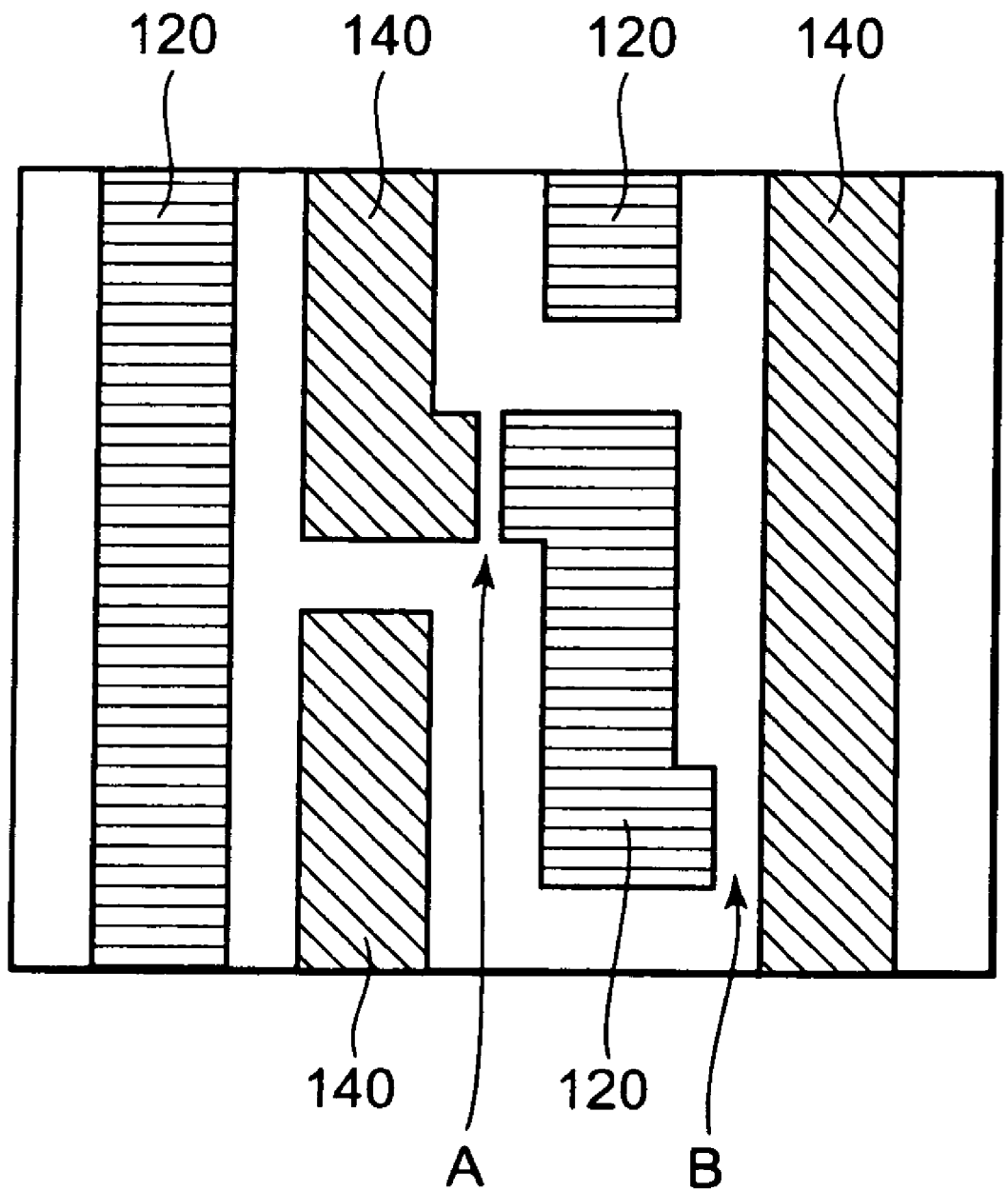
FIG. 6 is a view illustrating a second example of the correcting process for the overlapping margin, which is executed by the margin correcting unit.

FIG. 6 is a view illustrating a second example of the correcting process for the overlapping margin, which is executed by the margin correcting unit 350. In this example, the margin correcting unit 350 moves the first pattern 120 by the overlapping margin in an orthogonal direction (specifically, a right side in FIG. 6) to an extension direction of the full pattern 100. Thereby, the first pattern 120 and the second pattern 140 relatively move by the overlapping margin in such a direction that the part A, in which the first pattern 120 and the second pattern 140 are to be connected to each other, is mutually separated. Meanwhile, in this case, a direction, in which the first pattern 120 moves, is also a direction in which the part B, in which the first pattern 120 and the second pattern 140 are to be separated from each other, becomes mutually closer.

In this example, the determining unit 370 determines whether or not the first pattern 120 and the second pattern 140 are overlapped with each other by a criterion width or more in the part A in which the first pattern 120 and the second pattern 140 are to be overlapped with each other. The determining unit 370 determines whether or not the first pattern 120 and the second pattern 140 are separated from each other by the criterion value or more in the part B in which the first pattern 120 and the second pattern 140 are to be separated from each other.

Figure 7:
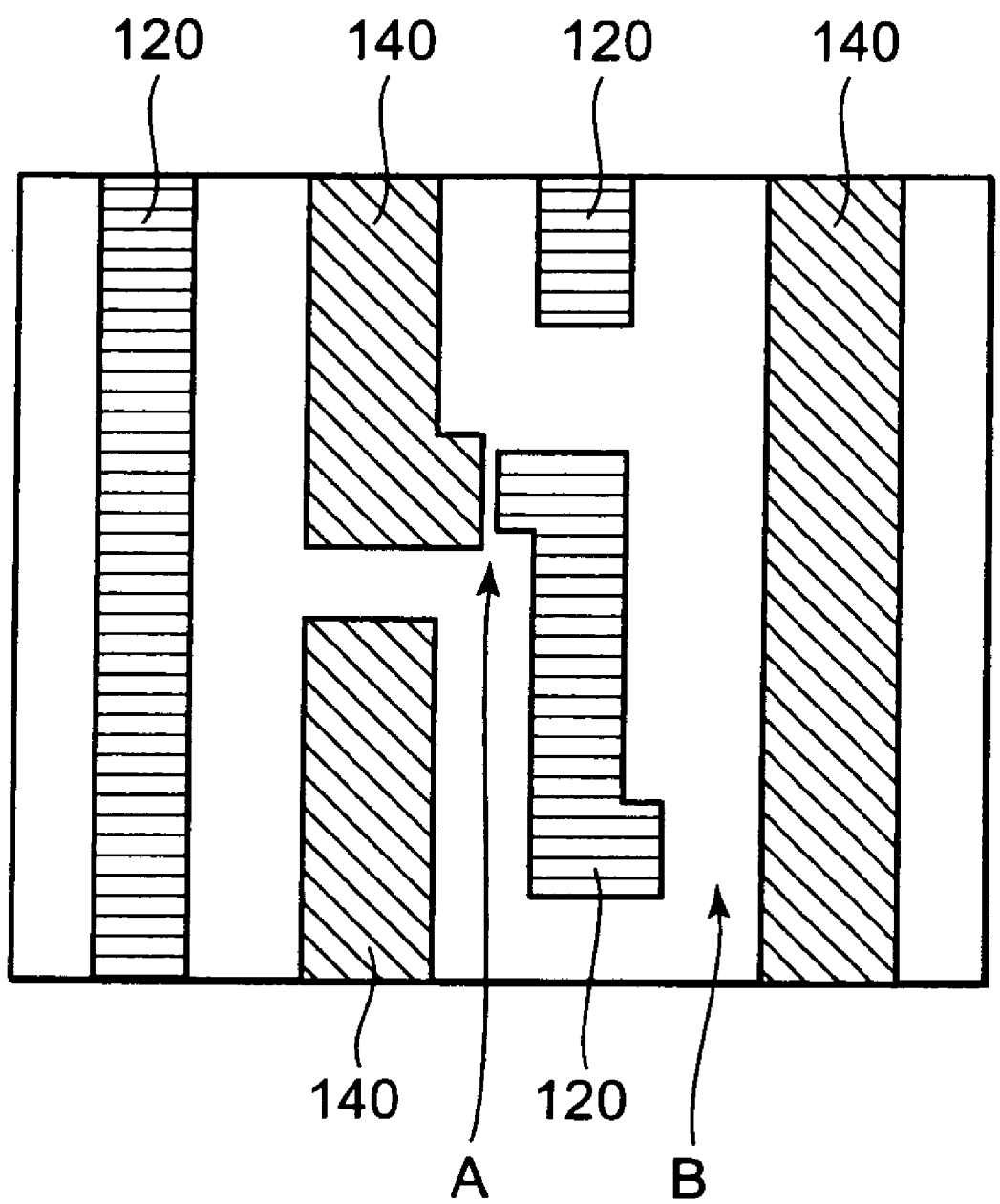
FIG. 7 is a view illustrating a third example of the correcting process for the overlapping margin, which is executed by the margin correcting unit.

FIG. 7 is a view illustrating a third example of the correcting process for the overlapping margin, which is executed by the margin correcting unit 350. In this example, the margin correcting unit 350 thins at least one of the first pattern 120 and the second pattern 140 by the overlapping margin throughout all circumferences. In an example illustrated in FIG. 7, the margin correcting unit 350 thins the first pattern 120 by the overlapping margin throughout all circumferences.

In this example, the determining unit 370 determines whether or not the first pattern 120 and the second pattern 140 are overlapped with each other by the criterion width or more in the part A in which the first pattern 120 and the second pattern 140 are to be overlapped with each other.

In the examples illustrated in FIG. 5 and FIG. 6, when the relative distance is not the criterion value or more in the part B in which the first pattern 120 and the second pattern 140 are to be separated from each other, the pattern correcting unit 340 corrects at least one of the first pattern 120 and the second pattern 140 so that the first pattern 120 and the second pattern 140 are separated by the criterion value or more in the part B. In the examples illustrated in FIG. 4 and FIG. 5, this correction is, for example, a process for moving the edge of the first pattern 120, which faces the part B, in a direction (left side in FIG. 4 and FIG. 5) in which the edge is separated from the second pattern 140.

In the examples illustrated in FIG. 6 and FIG. 7, when an overlapping width is the criterion value or less in the part A in which the first pattern 120 and the second pattern 140 are to be overlapped with each other, the pattern correcting unit 340 corrects at least one of the first pattern 120 and the second pattern 140 so that the first pattern 120 and the second pattern 140 are overlapped by the criterion width or more in the part A. In the example illustrated in FIG. 6, this correction is, for example, a process for moving the edge of the first pattern 120, which faces the part A, in a direction (left side in FIG. 6) in which the edge becomes closer to the second pattern 140, or a process for moving the edge of the second pattern 140, which faces the part A, in a direction (right side in FIG. 6) in which the edge becomes closer to the first pattern 120.

Figure 8:
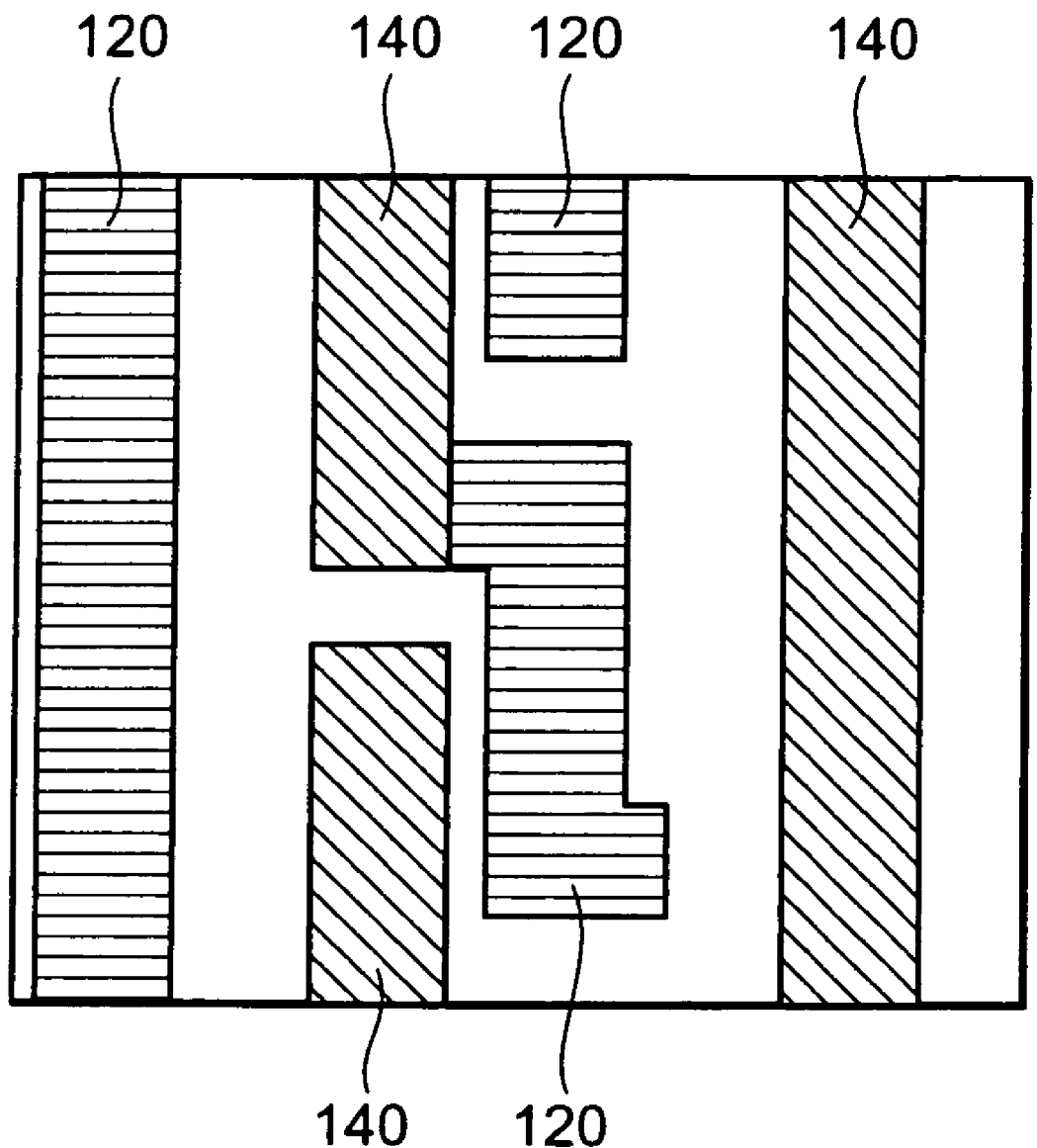
FIG. 8 is a view illustrating a fourth example of the correcting process for the overlapping margin, which is executed by the margin correcting unit.

FIG. 8 is a view illustrating a fourth example of the correcting process for the overlapping margin, which is executed by the margin correcting unit 350. In this example, the margin correcting unit 350 moves the first pattern 120 by the overlapping margin in an orthogonal direction (specifically, a left side in FIG. 8) to an extension direction of the full pattern 100.

Figure 9A:
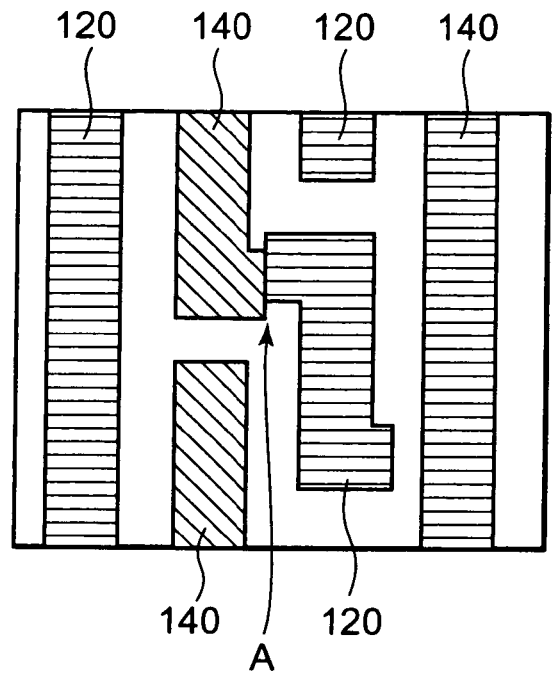
FIG. 9A is a view illustrating a fifth example of the correcting process for the overlapping margin, which is executed by the margin correcting unit.

FIG. 9A is a view illustrating a fifth example of the correcting process for the overlapping margin, which is executed by the margin correcting unit 350. In this example, the margin correcting unit 350 moves the first pattern 120 by the overlapping margin in the extension direction (specifically, an upper side in FIG. 9A) of the full pattern 100.

Figure 9B:
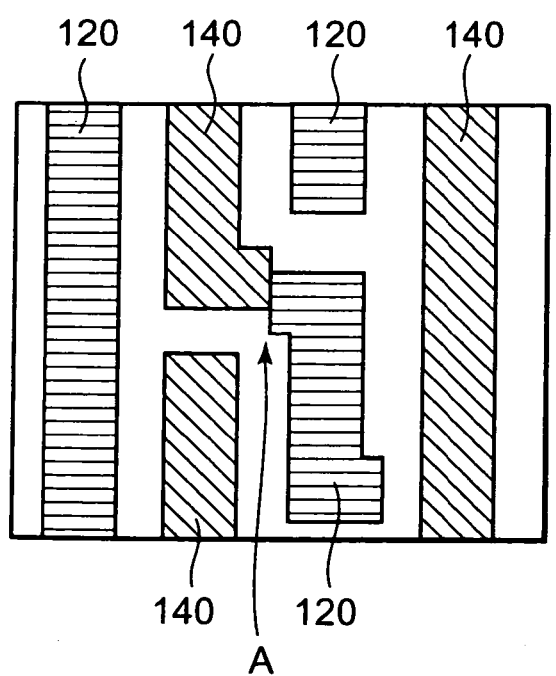
FIG. 9B is a view illustrating a sixth example of the correcting process for the overlapping margin, which is executed by the margin correcting unit.

FIG. 9B is a view illustrating a sixth example of the correcting process for the overlapping margin, which is executed by the margin correcting unit 350. In this example, the margin correcting unit 350 moves the first pattern 120 by the overlapping margin in the extension direction (specifically, a down side in FIG. 9B) of the full pattern 100.

Figure 10:
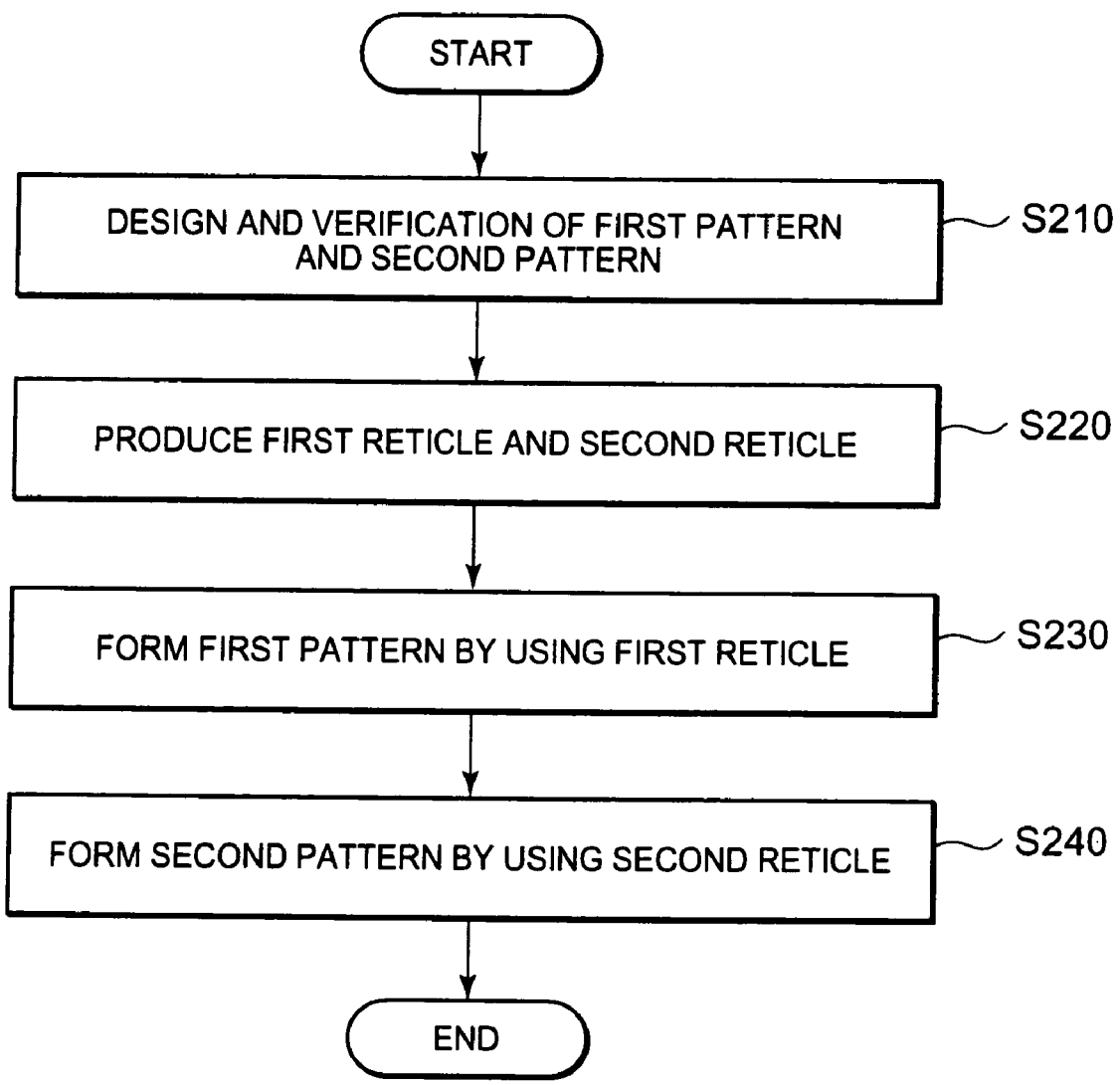
FIG. 10 is a flowchart illustrating a manufacturing method of a semiconductor device, in which the pattern verifying method illustrated in FIG. 1 is used.

FIG. 10 is a flowchart illustrating a manufacturing method of the semiconductor device, in which the pattern verifying method illustrated in FIG. 1 is used. In this manufacturing method of the semiconductor device, first, the first pattern and the second pattern of the semiconductor device are designed by using the pattern verifying method illustrated in FIG. 1 (S210). Next, the first reticle and the second reticle corresponding to the first pattern are produced (S220). Next, the first pattern is formed in the film to be processed by using the first reticle (S230), and after that, the second pattern is formed in the film to be processed by using the second reticle (S240). The film to be processed may be the pattern configured in the semiconductor device, or may be a hard mask for forming the pattern configured in the semiconductor device. In the latter case, such a step is executed, in that the etching using the hard mask is executed after S240, and the pattern configured in the semiconductor device is formed.

Next, operation effects of the present invention will be described. First, the overlapping margin of the second pattern for the first pattern is corrected to at least one of the first pattern and the second pattern. Next, it is determined whether or not the relative distance between the first pattern and the second pattern after the overlapping margin is corrected satisfies the criterion. Thus, the pattern can be verified under the consideration of the overlapping margin of the first pattern and the second pattern.

Thus, when the semiconductor device is manufactured, it is possible to prevent a yield of the semiconductor device from being lowered because of the overlapping margin of the first pattern and the second pattern. Particularly, since the first pattern includes the two sub-patterns separated from each other, when the second pattern is positioned between the two sub-patterns, this advantageous effect becomes remarkable.

The step of correcting the overlapping margin to at least one of the first pattern and the second pattern is the step of fattening or thinning, by the overlapping margin, at least one of the first pattern and the second pattern, or the step of moving, by the overlapping margin, the first pattern and the second pattern. Thus, a calculation quantity can be small, which is executed by the pattern verifying device in the step of correcting the overlapping margin.

When the relative distance between the first pattern and the second pattern after the overlapping margin is corrected does not satisfy the first criterion condition, the pattern correcting unit 380 corrects at least one of the first pattern and the second pattern, and causes the relative distance to satisfy the criterion. Thus, work for correcting the pattern becomes smaller.

Figure 11:
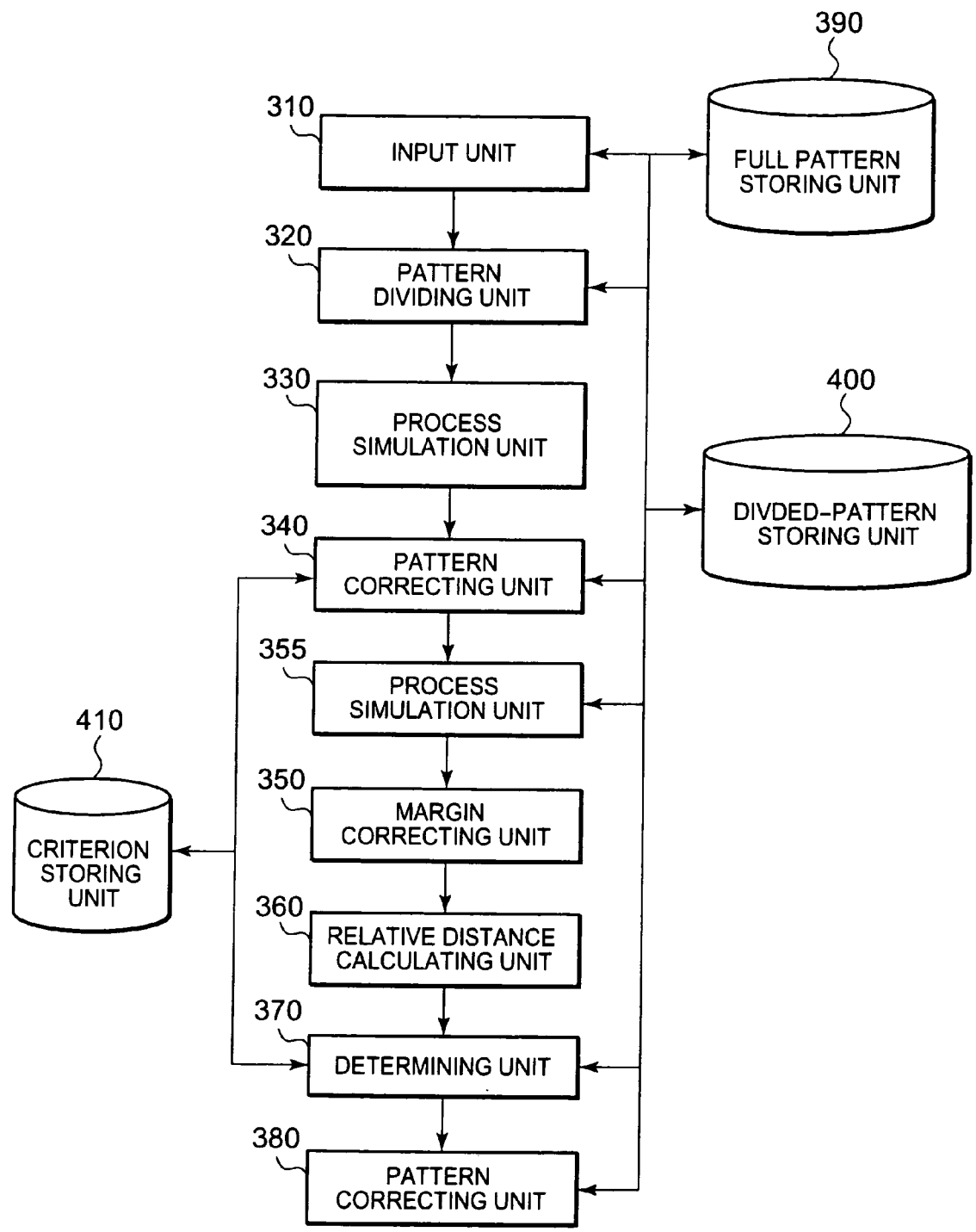
FIG. 11 is a block diagram illustrating a configuration of the pattern verifying device according to a second embodiment.

FIG. 11 is a block diagram illustrating a configuration of the pattern verifying device according to a second embodiment. This pattern verifying device is a device executing the process simulation for the first pattern and the second pattern when verifying the overlapping margin, and includes the same configuration as that of the pattern verifying device according to the first embodiment except that a process simulation unit 355 is included. Details of operations executed by the process simulation unit 355 will be described in detail later by using a flowchart.

Figure 12:
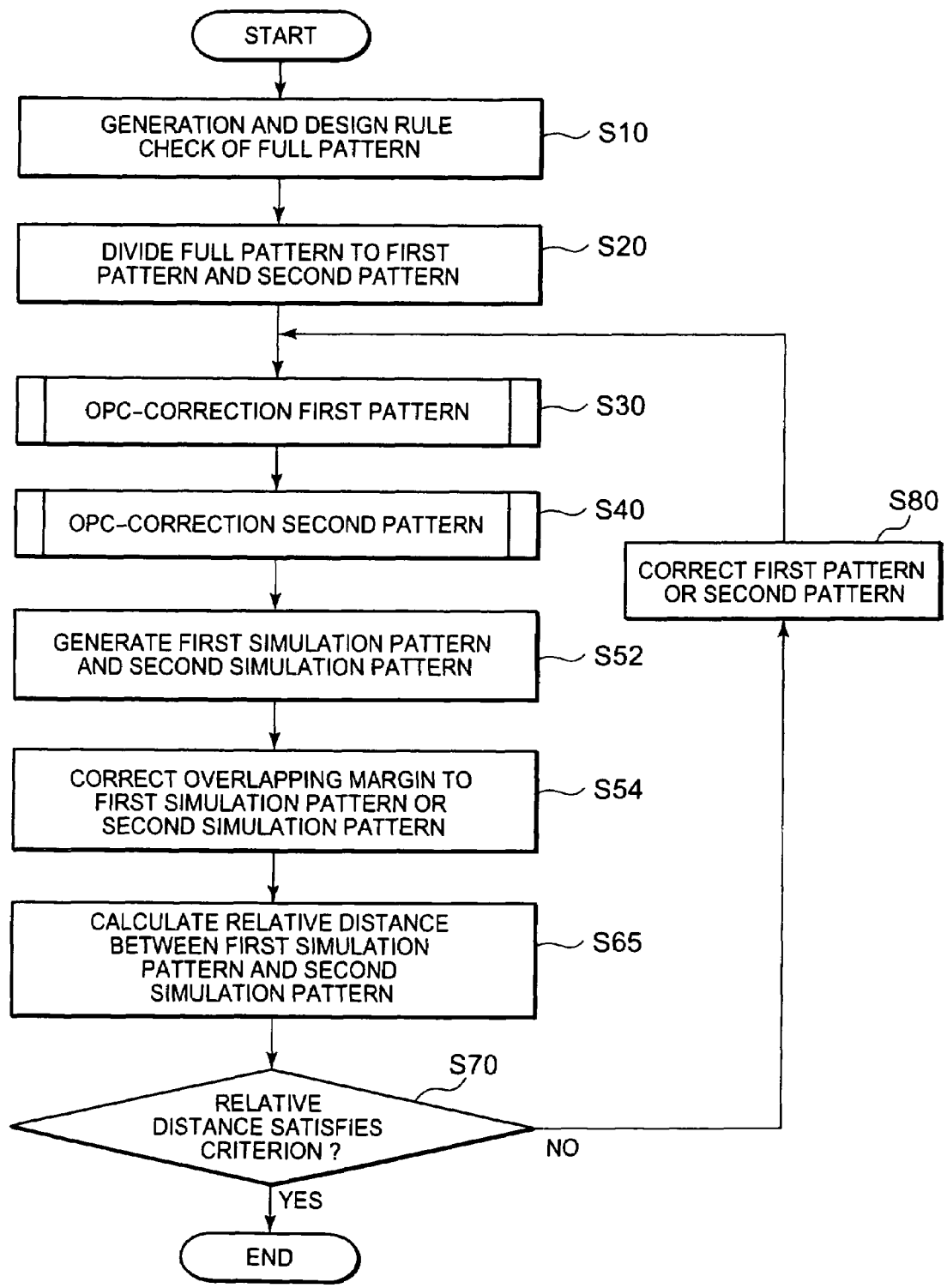
FIG. 12 is a flowchart illustrating the pattern verifying method in which the pattern verifying device illustrated in FIG. 11 is used.

FIG. 12 is a flowchart illustrating the pattern verifying method in which the pattern verifying device illustrated in FIG. 11 is used. In this pattern verifying method, the processes indicated at S10 to S40 are the same as those of the first embodiment, so that the description will be omitted. After completing the correction (S30 and S40), the pattern correcting unit 340 outputs, to the process simulation unit 355, a signal indicating such a fact that the correction is completed.

When the signal indicating such a fact that the correction is completed is inputted, the process simulation unit 355 reads out the first pattern and the second pattern from the divided-pattern storing unit 400, and executes the process simulation for the first pattern and the second pattern to generate a first simulation pattern and a second simulation pattern (S52). The process simulation executed here is the same as the process executed by the process simulation unit 330. The process simulation unit 355 outputs the first simulation pattern and the second simulation pattern to the margin correcting unit 350.

The margin correcting unit 350 corrects the overlapping margin to at least one of the first simulation pattern and the second simulation pattern (S54). This process is the same as that at S50 of FIG. 1 except that the first simulation pattern and the second simulation pattern are used instead of the first pattern and the second pattern.

Next, the relative distance calculating unit 360 calculates the relative distance between the first simulation pattern and the second simulation pattern after the overlapping margin is corrected (S65). This process is the same as that at S60 of FIG. 1 except that the first simulation pattern and the second simulation pattern are used instead of the first pattern and the second pattern.

Since the following processes (S70 and S80) are the same as those of the first embodiment, the description will be omitted. After the first pattern and the second pattern are verified by the pattern verifying method, the semiconductor device is manufactured by the method indicated at S220 to S240 of FIG. 10.

According to the present embodiment, the same advantageous effect as that of the first embodiment can be obtained. Since the first simulation pattern and the second simulation pattern are used in the process for verifying the overlapping margin, verification accuracy of the overlapping margin is improved.

Figure 13:
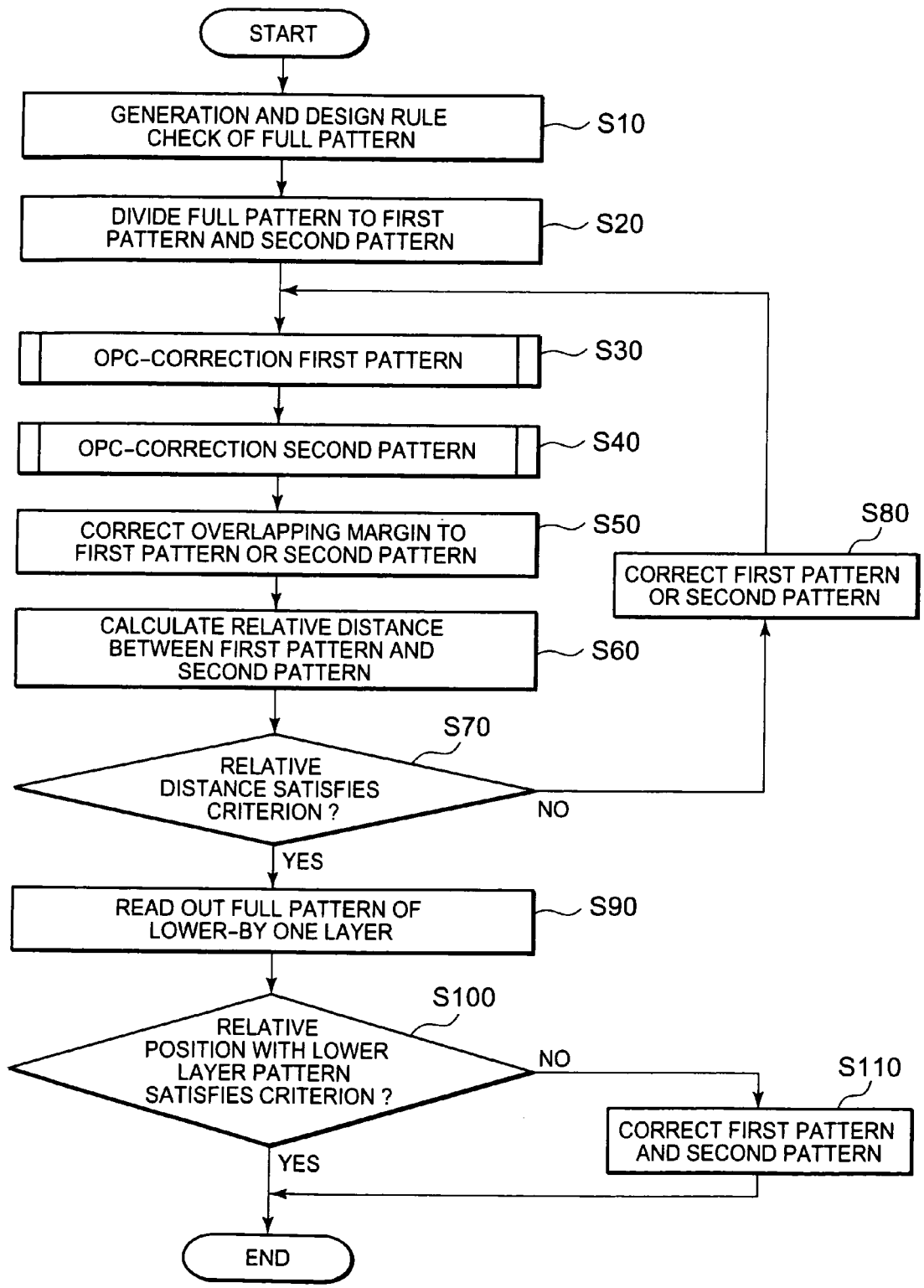
FIG. 13 is a flowchart illustrating an example of the pattern verifying method according to a third embodiment.

FIG. 13 is a flowchart illustrating an example of the pattern verifying method according to a third embodiment. The pattern verifying device used for the pattern verifying method according to the third embodiment is the same as the pattern verifying device indicated in the first embodiment or the second embodiment. After executing the process indicated in the first embodiment or the process indicated in the second embodiment, the pattern verifying method according to the present embodiment executes the following process. Meanwhile, FIG. 13 exemplifies such a case that the process indicated in the first embodiment is executed.

When the relative distance between the first pattern and the second pattern satisfies the criterion (S70: Yes), the determining unit 370 reads out, from the full pattern storing unit 390, the full pattern of the layer which is positioned under the layer being currently processed (S90). The determining unit 370 determines whether or not a relative position between the first pattern and the second pattern, and the read-out full pattern satisfies the criterion (S100). This criterion is stored in the criterion storing unit 410. When the relative position satisfies the criterion in every part (S100: Yes), the pattern verifying device completes an operation. When the relative position dose not satisfy the criterion in some parts (S100: No), the determining unit 370 outputs, to the pattern correcting unit 380, the correction information indicating how the first pattern and the second pattern are to be corrected.

When the first pattern and the second pattern are, for example, wiring patterns, a layer, which is positioned under another layer of the first pattern and the second pattern, includes a layout of a via or a contact. When the first pattern and the second pattern are processed according to S10 to S80, in some cases, the patterns of the first pattern and the second pattern are not overlapped with the via or the contact. The correction information becomes, for example, information indicating that the first pattern and the second pattern are shifted in what direction and by what distance from the via or the contact.

The pattern correcting unit 380 reads out, from the divided-pattern storing unit 400, the first pattern and the second pattern. Next, the pattern correcting unit 380 corrects the first pattern and the second pattern based on the correction information inputted from the determining unit 370 (S110). This correction is, for example, the process for moving the first pattern and the second pattern in mutually the same direction and by mutually the same distance. The pattern correcting unit 380 updates the first pattern and the second pattern stored in the divided-pattern storing unit 400 to the corrected first pattern and second pattern.

After the first pattern and the second pattern are verified by this pattern verifying method, the semiconductor device is manufactured by the method illustrated in FIG. 10.

According to the present embodiment, the same advantageous effect as that of the first embodiment can be obtained. After the overlapping margin of the first pattern and the second pattern is verified, the overlapping margin between the first pattern and the second pattern, and the pattern of the layer which is positioned under the layer of the first pattern and the second pattern is further verified. Thus, because of the correction for eliminating the overlapping margin of the first pattern and the second pattern, it is possible to prevent the positions of the first pattern and the second pattern from being shifted from the position of the pattern of the layer which is lower by one than the layer of the first pattern and the second pattern.

As described above, while the embodiments of the present invention have been described by referring to the drawings, such embodiments are exemplified for the present invention, and a variety of configurations other than the above configurations can be also adopted.

What is claimed is:

1. A pattern verifying method, which divides a full pattern into a first pattern and a second pattern, which is used for a double patterning method for forming the second pattern in a film to be processed after forming the first pattern in the film to be processed, for verifying the first pattern and the second pattern, said pattern verifying method comprising:

simulating a double patterning exposure process of the first pattern and the second pattern to generate a first simulated pattern and a second simulated pattern;

correcting, by using a computer, at least one of the first pattern and the second pattern based on an overlapping margin between the first simulated pattern and the second simulated pattern, which includes an allowable alignment mismatch amount when the second pattern is aligned to the first pattern;

calculating a relative distance between the first simulated pattern and the second simulated pattern after the overlapping margin is corrected; and determining whether the relative distance is wider than a criterion value by:

determining whether the first simulated pattern and the second simulated pattern are separated from each other by the criterion value or more in a part in which the first pattern and the second pattern are to be separated from each other;

determining whether the first simulated pattern and the second simulated pattern are overlapped with each other by the criterion value or more in a part in which the first pattern and the second pattern are to be overlapped with each other;

correcting at least one of the first pattern and the second pattern so that the first simulated pattern and the second simulated pattern are separated from each other by the criterion value or more in the part in which the first pattern and the second pattern are to be separated from each other when the relative distance does not satisfy the criterion; and correcting at least one of the first pattern and the second pattern so that the first simulated pattern and the second simulated pattern are overlapped with each other by the criterion value or more in a part in which the first pattern and the second pattern are to be overlapped with each other when the relative distance does not satisfy the criterion.

2. The pattern verifying method according to claim 1, wherein the first pattern includes two sub-patterns separated from each other, and the second pattern is positioned between the two sub-patterns.

3. The pattern verifying method according to claim 1, wherein the correcting based on the overlapping margin is fattening at least one of the first pattern and the second pattern by the overlapping margin throughout all circumferences.

4. The pattern verifying method according to claim 3, further comprising:

determining whether a relative position between a lower layer pattern positioned under the film to be processed, and the first pattern and the second pattern is wider than the criterion value; and correcting the first pattern and the second pattern when the relative position between the lower layer pattern, and the first pattern and the second pattern is not wider than the criterion.

5. The pattern verifying method according to claim 4, wherein the correcting of the first pattern and the second pattern comprises moving the first pattern and the second pattern in mutually the same direction and by mutually the same distance.

6. The pattern verifying method according to claim 1, wherein the correcting based on the overlapping margin is causing the relative distance between the first pattern and the second pattern to be smaller by the overlapping margin.

7. The pattern verifying method according to claim 6, further comprising:

determining whether a relative position between a lower layer pattern positioned under the film to be processed, and the first pattern and the second pattern is wider than the criterion value; and correcting the first pattern and the second pattern when the relative position between the lower layer pattern, and the first pattern and the second pattern is not wider than the criterion.

8. The pattern verifying method according to claim 7, wherein the correcting of the first pattern and the second pattern comprises moving the first pattern and the second pattern in mutually the same direction and by mutually the same distance.

9. The pattern verifying method according to claim 1, wherein the correcting based on the overlapping margin comprises thinning at least one of the first pattern and the second pattern by the overlapping margin throughout all circumferences.

10. The pattern verifying method according to claim 1, wherein the correcting based on the overlapping margin comprises causing the relative distance between the first pattern and the second pattern to be larger by the overlapping margin.

11. A pattern verifying device, which divides a full pattern into a first pattern and a second pattern, which is used for a double patterning method for forming the second pattern in a film to be processed after forming the first pattern in the film to be processed, and verifies the first pattern and the second pattern, said pattern verifying device comprising:
 at least one processor;
 a unit for simulating, using the processor, a double patterning exposure of the first pattern and the second pattern to generate a first simulated pattern and a second simulated pattern;
 a margin correcting unit, using the processor, which corrects at least one of the first pattern and the second pattern based on an overlapping margin between the first simulated pattern and the second simulated pattern which includes an allowable alignment mismatch amount when the second pattern is aligned to the first pattern;
 a relative distance calculating unit, using the processor, which calculates a relative distance between the first simulated pattern and the second simulated pattern after the overlapping margin is corrected; and
 a determining unit, using the processor, which determines whether the relative distance is wider than a criterion value by:
 determining whether the first simulated pattern and the second simulated pattern are separated from each other by the criterion value or more in a part in which the first pattern and the second pattern are to be separated from each other;
 determining whether the first simulated pattern and the second simulated pattern are overlapped with each other by the criterion value or more in a part in which the first pattern and the second pattern are to be overlapped with each other;
 correcting at least one of the first pattern and the second pattern so that the first simulated pattern and the second simulated pattern are separated from each other by the criterion value or more in the part in which the first pattern and the second pattern are to be separated from each other when the relative distance does not satisfy the criterion; and
 correcting at least one of the first pattern and the second pattern so that the first simulated pattern and the second simulated pattern are overlapped with each other by the criterion value or more in a part in which the first pattern and the second pattern are to be overlapped with each other when the relative distance does not satisfy the criterion.

12. A non-transitory computer-readable medium storing a program for causing a computer to function as a pattern verifying device, the pattern verifying device dividing a full pattern into a first pattern and a second pattern, and verifying the first pattern and the second pattern in a double patterning method for forming the first pattern and the second pattern in a film to be processed in this order, causing the computer to comprise:
 a function for simulating a double patterning process of the first pattern and the second pattern to generate a first simulated pattern and a second simulated pattern;
 a function for correcting at least one of the first pattern and the second pattern based on an overlapping margin between the first simulated pattern and the second simulated pattern, which includes an allowable alignment mismatch amount when the second pattern is aligned to the first pattern;
 a function for calculating a relative distance between the first simulated pattern and the second simulated pattern after the overlapping margin is corrected; and
 a function for determining whether the relative distance is wider than a criterion value by:
 determining whether the first simulated pattern and the second simulated pattern are separated from each other by the criterion value or more in a part in which the first pattern and the second pattern are to be separated from each other;
 determining whether the first simulated pattern and the second simulated pattern are overlapped with each other by the criterion value or more in a part in which the first pattern and the second pattern are to be overlapped with each other;
 correcting at least one of the first pattern and the second pattern so that the first simulated pattern and the second simulated pattern are separated from each other by the criterion value or more in the part in which the first pattern and the second pattern are to be separated from each other when the relative distance does not satisfy the criterion; and
 correcting at least one of the first pattern and the second pattern so that the first simulated pattern and the second simulated pattern are overlapped with each other by the criterion value or more in a part in which the first pattern and the second pattern are to be overlapped with each other when the relative distance does not satisfy the criterion.

13. A manufacturing method of a semiconductor device, the method dividing a full pattern into a first pattern and a second pattern, said method comprising:
 verifying the first pattern and the second pattern;
 forming a first reticle for forming the first pattern, and forming a second reticle for forming the second pattern after the verifying;
 forming the first pattern in the film to be processed by using the first reticle; and
 forming the second pattern in the film to be processed by using the second reticle,
 wherein the verifying the first pattern and the second pattern including: simulating, by using a computer, a double patterning exposure process of the first pattern and the second pattern to generate a first simulated pattern and a second simulated pattern;
 correcting at least one of the first pattern and the second pattern based on an overlapping margin between the first simulated pattern and the simulated second pattern, which includes an allowable alignment mismatch amount when the second pattern is aligned to the first pattern;
 calculating a relative distance between the first simulated pattern and the second simulated pattern after the overlapping margin is corrected; and
 determining whether the relative distance is wider than a criterion value by:
 determining whether the first simulated pattern and the second simulated pattern are separated from each other by the criterion value or more in a part in which the first pattern and the second pattern are to be separated from each other;
 determining whether the first simulated pattern and the second simulated pattern are overlapped with each other by the criterion value or more in a part in which the first pattern and the second pattern are to be overlapped with each other;

correcting at least one of the first pattern and the second pattern so that the first simulated pattern and the second simulated pattern are separated from each other by the criterion value or more in the part in which the first pattern and the second pattern are to be separated from each other when the relative distance does not satisfy the criterion; and correcting at least one of the first pattern and the second pattern so that the first simulated pattern and the second simulated pattern are overlapped with each other by the criterion value or more in a part in which the first pattern and the second pattern are to be overlapped with each other when the relative distance does not satisfy the criterion.

14. The manufacturing method of a semiconductor device according to claim 13, wherein the first pattern includes two sub-patterns separated from each other, and wherein the second pattern is positioned between the two sub-patterns.

* * * * *